(12) United States Patent
Kim

(10) Patent No.: US 10,164,238 B2
(45) Date of Patent: Dec. 25, 2018

(54) METHOD FOR MANUFACTURING BATTERY PROTECTION DEVICE AND BATTERY PROTECTION DEVICE

(71) Applicants: TES CO., LTD, Gyeonggi-do (KR); Young Dae Kim, Gyeonggi-do (KR)

(72) Inventor: Young Dae Kim, Gyeonggi-do (KR)

(73) Assignees: TES CO., LTD, Yongin-si, Gyeonggi-do (KR); Young Dae Kim, Seongnam-si, Gyeonggi-do (KR)

( * ) Notice: Subject to any disclaimer, the term of this patent is extended or adjusted under 35 U.S.C. 154(b) by 630 days.

(21) Appl. No.: 14/759,197

(22) PCT Filed: Mar. 28, 2014

(86) PCT No.: PCT/KR2014/002652
§ 371 (c)(1),
(2) Date: Jan. 20, 2016

(87) PCT Pub. No.: WO2014/168363
PCT Pub. Date: Oct. 16, 2014

(65) Prior Publication Data
US 2016/0133911 A1    May 12, 2016

(30) Foreign Application Priority Data

Apr. 12, 2013   (KR) .................. 10-2013-0040425

(51) Int. Cl.
*H01M 2/34*     (2006.01)
*H01M 10/42*    (2006.01)
*H05K 3/46*     (2006.01)
*H05K 1/14*     (2006.01)
*H05K 3/40*     (2006.01)
*H05K 1/05*     (2006.01)

(52) U.S. Cl.
CPC .......... *H01M 2/34* (2013.01); *H01M 10/425* (2013.01); *H01M 10/4257* (2013.01); *H05K 3/46* (2013.01); *H05K 3/4608* (2013.01); *H01M 2200/00* (2013.01); *H01M 2200/10* (2013.01); *H01M 2200/108* (2013.01); *H05K 1/053* (2013.01); *H05K 1/144* (2013.01); *H05K 3/4038* (2013.01); *H05K 2201/041* (2013.01)

(58) Field of Classification Search
CPC .. H01M 2/34; H01M 10/425; H01M 10/4257; H05K 3/46; H05K 3/4608
See application file for complete search history.

(56) References Cited

U.S. PATENT DOCUMENTS

| | | | |
|---|---|---|---|
| 7,781,089 B2 * | 8/2010 | Tan .................. | H01M 2/34 429/65 |
| 9,711,780 B2 * | 7/2017 | Park .................. | H01M 2/34 |
| 2008/0094032 A1 * | 4/2008 | Miyamoto ............ | H02J 7/0031 320/134 |

(Continued)

*Primary Examiner* — Ronald W Leja
*Assistant Examiner* — Christopher Clark
(74) *Attorney, Agent, or Firm* — Paratus Law Group, PLLC

(57) ABSTRACT

The present invention relates to a method for manufacturing a battery protection device and a battery protection device manufactured by the method, and more particularly, a method for manufacturing a battery protection device and a battery protection device which reduce a defect rate and also the number of processes, thus enhancing productivity.

12 Claims, 6 Drawing Sheets

(56) References Cited

U.S. PATENT DOCUMENTS

| | | | | |
|---|---|---|---|---|
| 2008/0116851 A1* | 5/2008 | Mori | ...................... | H01M 2/34 320/134 |
| 2009/0098418 A1* | 4/2009 | Byun | .................... | H01M 2/263 429/7 |
| 2010/0053835 A1* | 3/2010 | Kwag | ................. | H01M 2/0404 361/103 |
| 2010/0098974 A1* | 4/2010 | Kim | .................... | H01M 2/0404 429/7 |
| 2011/0299209 A1* | 12/2011 | Tajima | .................. | H02J 7/0031 361/104 |
| 2012/0301748 A1* | 11/2012 | Choi | ................... | H01M 2/0486 429/7 |
| 2013/0280558 A1* | 10/2013 | Hur | ..................... | H01M 2/0285 429/7 |
| 2013/0330574 A1* | 12/2013 | Byun | ...................... | H01M 2/34 429/7 |
| 2013/0335935 A1* | 12/2013 | Jung | ....................... | H01M 2/34 361/760 |
| 2014/0347776 A1* | 11/2014 | Na | ......................... | H01M 2/34 361/93.7 |
| 2015/0044514 A1* | 2/2015 | Kimura | ................ | H01H 37/761 429/7 |

\* cited by examiner

METHOD FOR MANUFACTURING BATTERY PROTECTION DEVICE AND BATTERY PROTECTION DEVICE

TECHNICAL FIELD OF THE INVENTION

The present invention relates to a method for manufacturing a battery protection device and a battery protection device manufactured by the method, and more particularly, a method for manufacturing a battery protection device and a battery protection device which reduce a defect rate and also the number of processes, thus enhancing productivity.

BACKGROUND OF THE INVENTION

In recent, various portable terminals such as smartphones, smart pads, etc. are widely used, and as an electrical source for such portable terminals, a chargeable secondary cell (hereinafter, briefly referred to as "battery") is generally used. A lithium-ion battery is a most widely-used battery in the portable terminal, but easily generates heat in a state of overcharge or overcurrent. Further, if heat generation is continued in the lithium-ion battery and a temperature thereof rises, a performance of the battery is deteriorated and also a risk of explosion is shown.

Therefore, a portable terminal battery pack of the conventional lithium-ion battery etc. contains a protection circuit module (hereinafter, briefly referred to as "PCM") which detects and interrupts the overcharge, overdischarge and overcurrent.

FIGS. 1a and 1b show circuit diagrams of conventional battery protection device, respectively. As illustrated in FIGS. 1a and 1b, the circuit of the conventional battery protection device mainly includes a protective IC (U0) containing two FETs (not illustrated) functioning as a switching element, a plurality of resistors (R1~R3), and a plurality of capacitors (C1~C2), etc. Meanwhile, the circuit in FIG. 1b further has a function of NFC (Near Field Communication) when compared to the circuit in FIG. 1a.

In FIG. 1, a "B+" terminal and a "B−" terminal are terminals connected to a battery cell and correspond to an input side of the PCM. A "P+" terminal and a "P−" terminal correspond to an output side of the PCM. Through these terminals, charging and discharging are performed across the PCM. Finally, a "CF" terminal is an ID terminal indicating the type of battery and is connected to the "P−" terminal via the resistor (R3), wherein a resistance value of the connected resistor determines a charge current. A "DUMMY" terminal is a terminal to which a metallic spacer described later is welded, and is electrically insulated from other components. That is, the "DUMMY" terminal does not have any electrical characteristics and is necessary only for mechanical fixation, and thus may be omitted according to circumstances.

FIGS. 2a to 2c show a top view, front view and bottom view of a conventional battery protection device, respectively. As illustrated in FIGS. 2a to 2c, the conventional battery protection device has longitudinal and transverse lengths approximately equal to those of a battery cell (40) so that the device can be mounted on an upper surface of the battery cell (40). Further, the conventional battery protection device includes a double-sided PCB (10) having patterns formed on its upper and lower surfaces, respectively.

In the configuration described above, mounted on the lower surface of the PCB are the protective IC, a circuit element (30) such as the plurality of resistors and capacitors, and a thermistor (32) as described above, while a plurality of pads, e.g. "P+" terminal, "CF" terminal and "P−" terminal are exposed on the upper surface. Reference numeral "12" in the figures designates an exposure hole which is formed through the PCB (10) to expose the thermistor (32) so that the thermistor (32) can be spot-welded to the battery cell (40).

Reference numeral "50" designates a structure made of insulating material, e.g. synthetic resin, which is interposed between the battery cell (40) and the PCB (10) of the PCM in order to electrically insulate the PCM circuit elements (30, 32) from the battery cell (40) and stably fix the PCM. Reference numeral "20" designates approximately "∠"-shaped metallic spacers which are attached to both end portions of the lower surface of the PCB (10), respectively to join the PCB (10) to the upper surface of the battery cell (40) by means of spot-welding for example.

By the construction described above, each metallic spacer (20) has a horizontal extension part (22) spot-welded to the PCB (10), a vertical wall part (24) vertically extending from an end of the horizontal extension part (22) with a height at least equal to thickness of the structure (50) made of synthetic resin, and a horizontal extension part (26) horizontally extending from other end of the vertical wall part (24) and spot-welded to the battery cell (40).

However, according to the conventional battery protection device as described above, the metallic spacers (20) separate from the PCB (10) have to be prepared and such metallic spacers (20) have to be soldered to the PCB (10) by means of SMT (Surface Mounting Technology), and thus there is a problem that much work time is required and the number of processes is increased, that is, a productivity is lowered. Also, there is further problem that a defect rate increase since alignment in a soldering process by means of the SMT process is difficult.

SUMMARY OF THE INVENTION

Technical Problems

The present invention has been made in order to solve the above-mentioned problem, and its object is to provide a method for manufacturing a battery protection device and a battery protection device which reduce a defect rate and also the number of processes, thus enhancing productivity.

Solution to the Problem

A method for manufacturing a battery protection device according to a first feature of the present invention for achieving the above-mentioned object includes: a step (a) of preparing an upper PCB plate having a metallic thin film formed on an upper surface thereof, a lower PCB plate having a metallic thin film formed on a lower surface thereof, and a metal plate for spacer which has at least one part laterally protruding from sides of the upper PCB plate and the lower PCB plate and which has at least one insulation hole formed through the metal plate for spacer; a step (b) of joining the upper PCB plate and the lower PCB plate to each other with the metal plate for spacer interposed there between; a step (c) of forming circuit patterns on the upper PCB plate and the lower PCB plate; a step (d) of forming through-holes smaller than the insulation hole through the upper PCB plate and the lower PCB plate, and electrically connecting the upper PCB plate and the lower PCB plate through the through-holes; a step (e) of forming an exposure hole in the upper PCB plate so as to expose the metal plate for spacer, and electrically connecting the metal plate for spacer and the upper PCB plate through the exposure hole; and a step (f) of bending a protruding part of the metal plate for spacer in two stages to form a vertical extension part and a horizontal extension part.

In the above-mentioned configuration, in the step (d), circuit connection points of the lower PCB plate and at least "P+" terminal, "P−" terminal and "CF" terminal of the upper PCB plate are electrically connected.

In the step (e), the "P+" terminal of the upper PCB plate and the metal plate for spacer are electrically connected.

The step (b) is performed using adhesive or adhesive sheet made of insulating material, and the inside of the insulation hole is filled with the adhesive or adhesive sheet after the step (b).

The metal plate for spacer is made of aluminum-, copper-, phosphor bronze- or beryllium copper plate having a nickel-plated surface or is made of aluminum-, copper-, phosphor bronze-, beryllium copper- or nickel plate.

The metal plate for spacer is divided into two right and left parts, and a space between the two parts is filled with insulating material.

A battery protection device according to a second feature of the present invention includes: an upper PCB plate which has a circuit pattern formed on an upper surface thereof; a metal plate for spacer which is joined to a lower part of the upper PCB plate and which laterally protrudes from at least one side of the upper PCB plate to form a vertical extension part and a horizontal extension part; and a lower PCB plate which has a circuit pattern formed on a lower surface thereof and which is joined to a lower part of the metal plate for spacer, wherein an insulation hole is formed through the metal plate for spacer, the upper PCB plate and the lower PCB plate are electrically connected through through-holes which are formed through the upper PCB plate and the lower PCB plate and which are smaller than the insulation hole, and the upper PCB plate and the metal plate for spacer are electrically connected through an exposure hole.

In the above-mentioned second feature, the lower PCB plate is connected to at least "P+" terminal, "P−" terminal and "CF" terminal of the upper PCB plate through the through-holes, and the "P+" terminal of the upper PCB plate is electrically connected to the metal plate for spacer through the exposure hole.

Effects of the Invention

According to the method for manufacturing a battery protection device and the battery protection device manufactured by the method of the present invention, a defect rate is reduced and the number of processes is also reduced, whereby productivity can be enhanced, and consequently a cost reduction can be achieved. Further, since the metal plate for spacer is interposed between the PCB plates, heat generated from PCM can be rapidly emitted and thus a reliability of the PCM is enhanced and a life thereof can be lengthened.

DETAILED DESCRIPTION OF THE INVENTION

In the following, detailed description will be made of preferred embodiments of a method for manufacturing a battery protection device and a battery protection device of the present invention with reference to the attached drawings.

Figure 4:
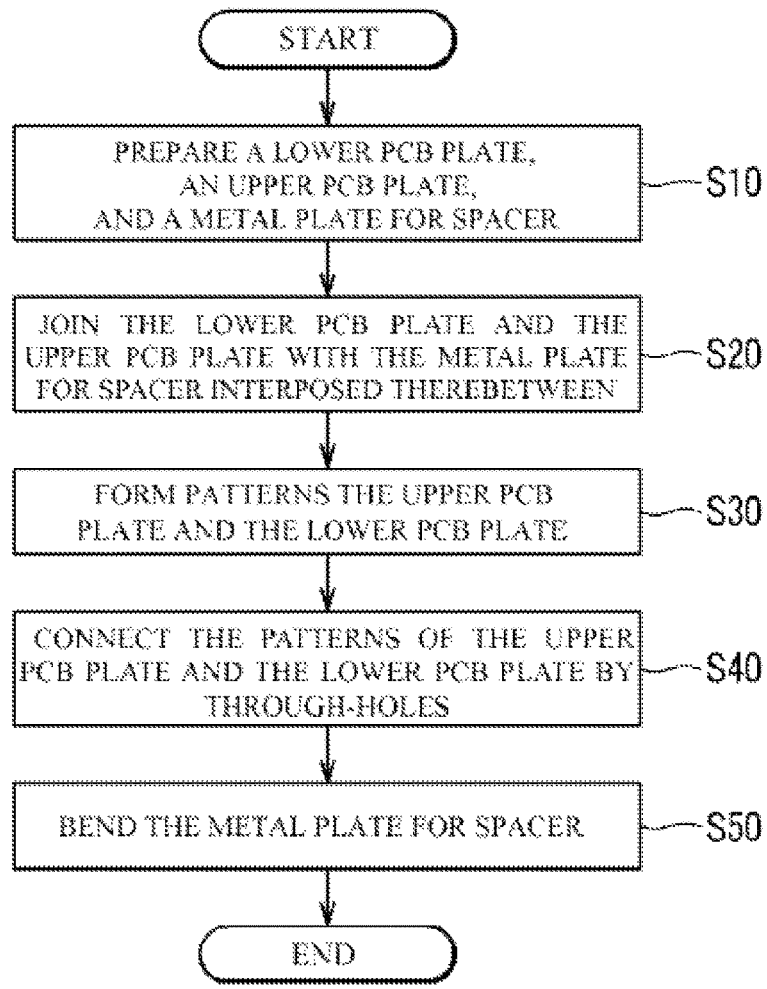
FIG. 4 is a process flowchart for describing a method for manufacturing a battery protection device of the present invention.
Figure 5A:
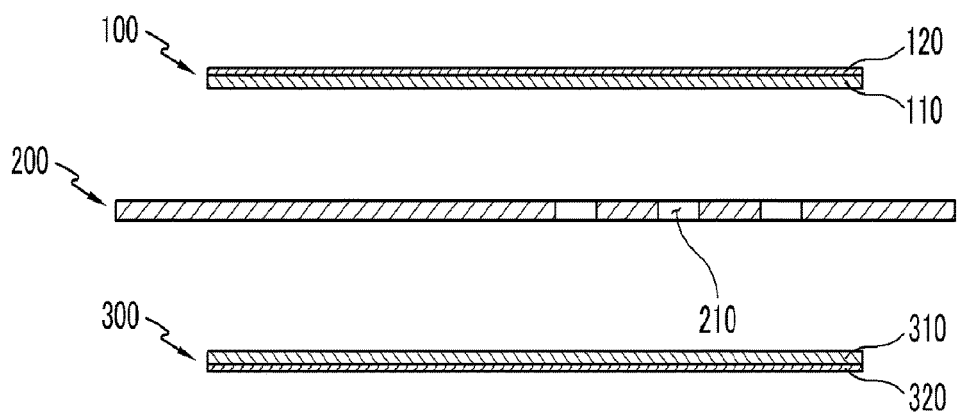
FIG. 5 shows sectional views for main steps of the method for manufacturing a battery protection device of the present invention.

FIG. 4 is a process flowchart for describing the method for manufacturing a battery protection device of the present invention. FIG. 5 shows sectional views for main steps of the method for manufacturing a battery protection device of the present invention. According to the method for manufacturing a battery protection device of the present invention, at step (S10), as illustrated in FIG. 5a, an upper PCB plate (100), a lower PCB plate (300) and a metal plate (200) functioning as a spacer (hereinafter, referred to as "metal plate for spacer") are prepared. At the step (S10), the upper PCB plate (100) includes a synthetic resin plate (110) e.g. a hard PCB made of FR4, BT or polyimide, or a flexible PCB, with a metallic thin film (120), preferably copper thin film, formed on an upper surface of the synthetic resin plate (110). The lower PCB plate (300) include a synthetic resin plate (310) e.g. a hard PCB made of FR4, BT or polyimide, or a flexible PCB, with a metallic thin film (320), preferably copper thin film, formed on a lower surface of the synthetic resin plate (310).

The upper PCB plate (100) and the lower PCB plate (300) are approximately identical to each other in size, and thus the two plates can completely overlap each other. The metal plate for spacer (200) has a longitudinal length equal to or slightly less than longitudinal lengths of the upper PCB plate (100) and the lower PCB plate (300), and has a transverse length greater than transverse lengths of the upper PCB plate (100) and the lower PCB plate (300), and thus the metal plate for spacer (200) laterally protrudes from both sides of each of the PCB plates when joined with the PCB plates.

Figure 1A:
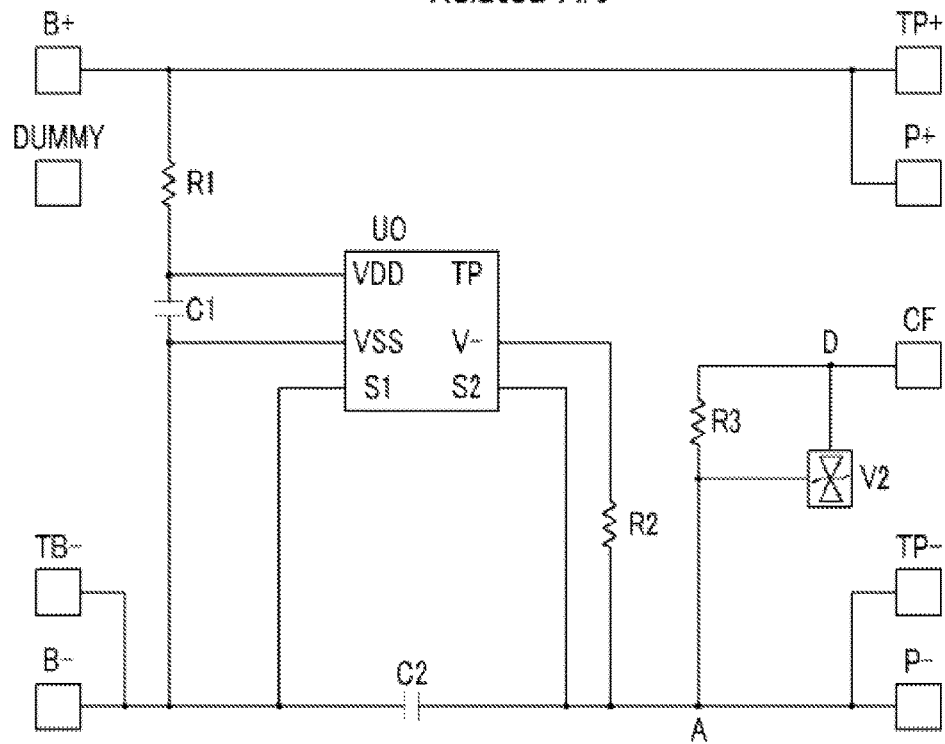
FIGS. 1a and 1b are circuit diagrams of various conventional battery protection devices.
Figure 1B:
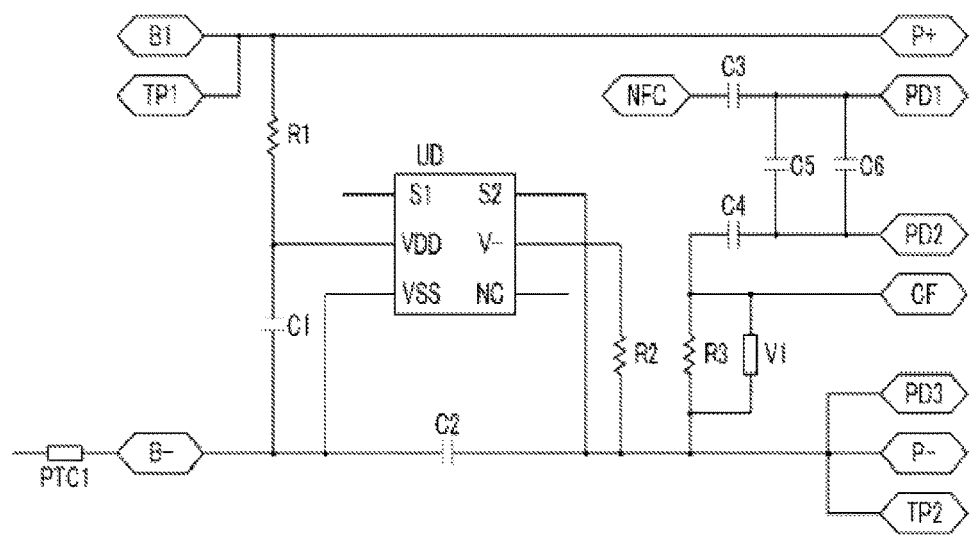
Figure 2A:
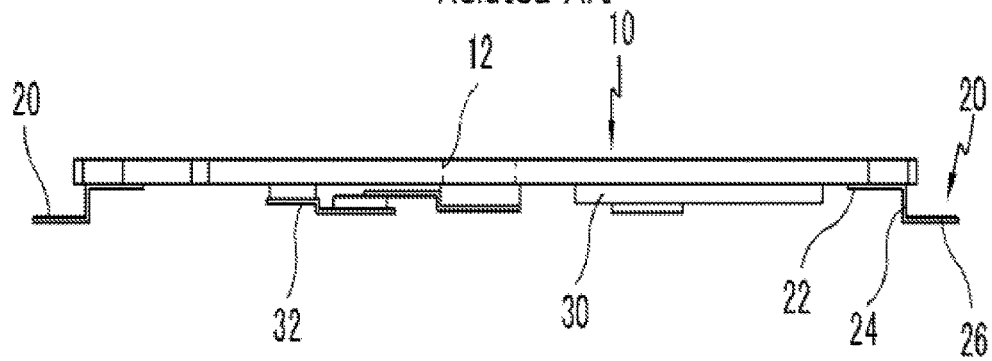
FIGS. 2a to 2c is a front view, top view and bottom view of a conventional battery protection device, respectively.
Figure 2B:
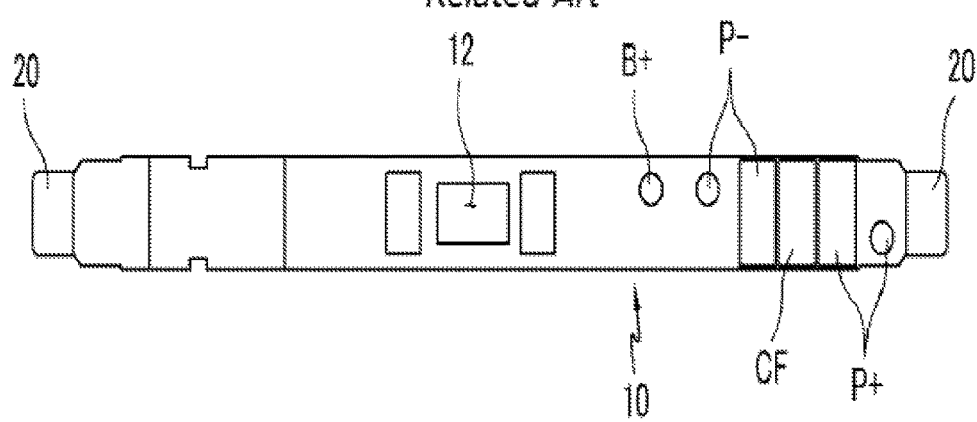
Figure 2C:
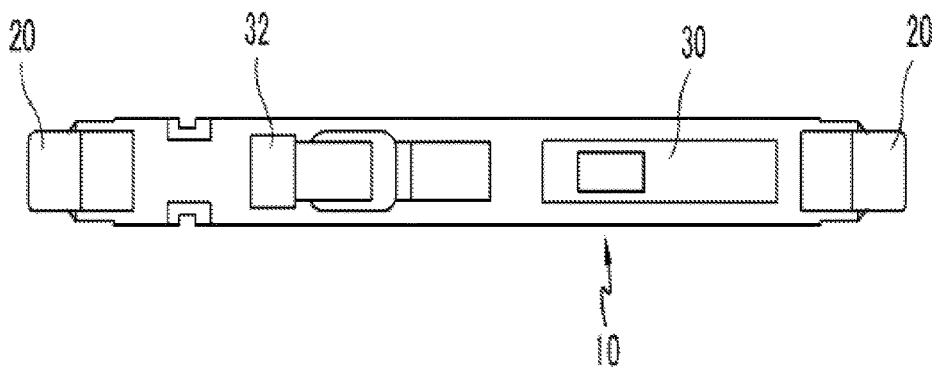
Figure 3:
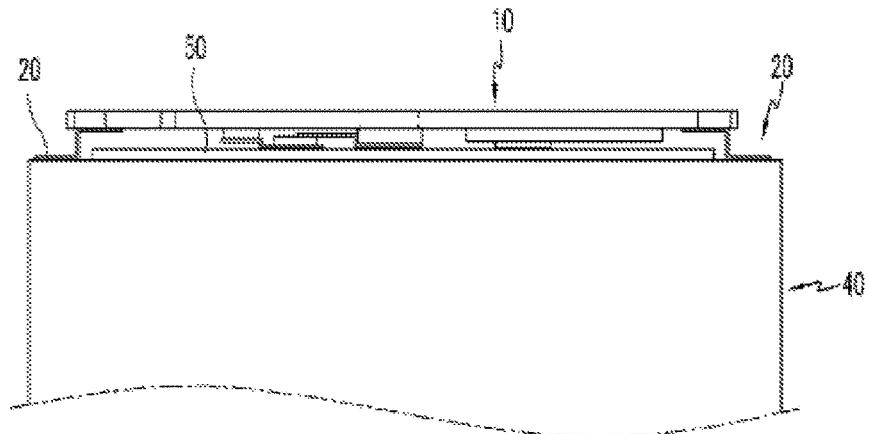
FIG. 3 is a configuration view for describing a function of a metallic spacer in the conventional battery protection device.

Meanwhile, in order that when establishing electrical connections between patterns on the upper PCB plate (100) and the lower PCB plate (300), e.g. between "P+" terminal on the upper PCB plate (100) and "B+" terminal on the lower PCB plate (300), between "P−" terminal on the upper PCB plate (100) and "A" point (refer to FIG. 1a) on the lower PCB plate (300) and between"CF" terminal on the upper PCB plate (100) and "D" point (refer to FIG. 1a) on the lower PCB plate (300), through respective through-holes (described later), the metal plate for spacer (200) is prevented from being electrically connected together, a hole (210)(hereinafter, referred to as "insulation hole") having a greater diameter than the through-holes is previously formed through the metal plate for spacer (200) by drilling, laser or press working (punching) for example.

The metal plate for spacer (200) may be made of metal plate of aluminum, copper, phosphor bronze, beryllium copper or nickel for example. In a case where the metal plate of nickel is not used, it is preferable to nickel-plate at least the protruding part of the metal plate for spacer in order to allow a secure spot-welding.

Figure 5B:
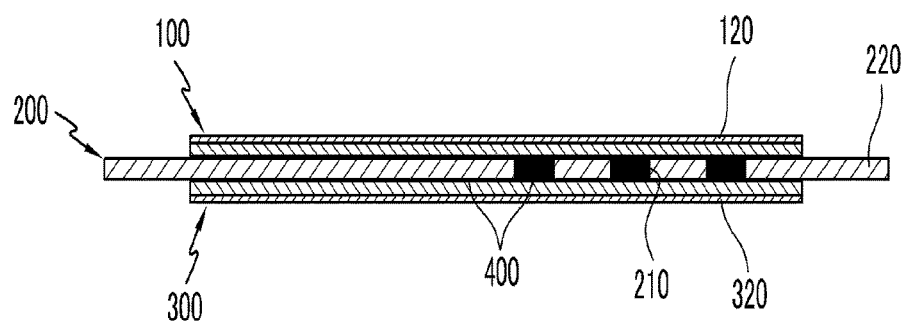

In step (S20), as illustrated in FIG. 5b, with the metal plate for spacer (200) interposed between the upper PCB plate (100) and the lower PCB plate (300), the two PCB plates are joined by thermo compression while adhesive (400) (or adhesive sheet; hereinafter, collectively referred to as "adhesive") made of insulating material, e.g. epoxy resin series is interposed between the metal plate for spacer (200) and each PCB plate, and accordingly, the adhesive (400) made of insulating material is filled in the insulation hole (210).

Figure 5C:
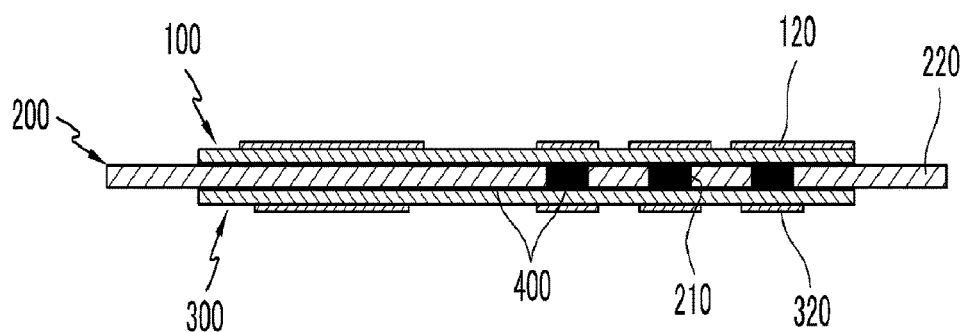

Next, in step (S30), circuit patterns are formed on the upper PCB plate (100) and the lower PCB plate (300) by a conventional method. In step (S40), as illustrated in FIG. 5c, through-holes having a diameter less than the insulation hole (210) formed through the metal plate for spacer (200) are formed through both the upper PCB plate (100) and the lower PCB plate (300) by drilling, laser or press working for example. In the step (S30), an exposure hole may be formed in the upper PCB plate (100) so as to expose the metal plate for spacer (200), wherein the exposure hole may be subsequently used to electrically connect the "P+" terminal (pad) formed on the upper PCB plate (100) and the metal plate for spacer (200).

Figure 5D:
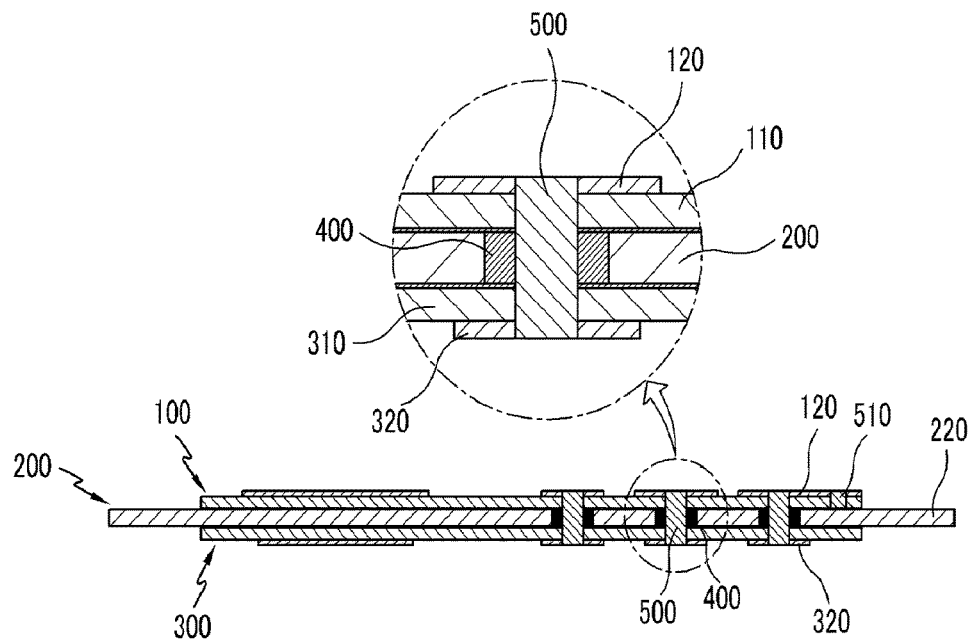

Next, as illustrated in FIG. 5d, by filling a plating body (500) in the through-holes and the exposure hole by a known plating process etc., the pattern on the upper PCB plate (100) and the pattern on the lower PCB plate (300), i.e. the "P−" terminal, the "CF" terminal, the "P+" terminal or "NFC" terminal are electrically connected, wherein related parts of the upper PCB plate (100) and the lower PCB plate (300) are electrically connected by such a plating body (500) while electrically insulated from the metal plate for spacer (200). In addition, by also filling a plating body (510) in the exposure hole, the pattern on the upper PCB plate (100) i.e. the "P+" terminal and the metal plate for spacer (200) are electrically connected.

Figure 5E:
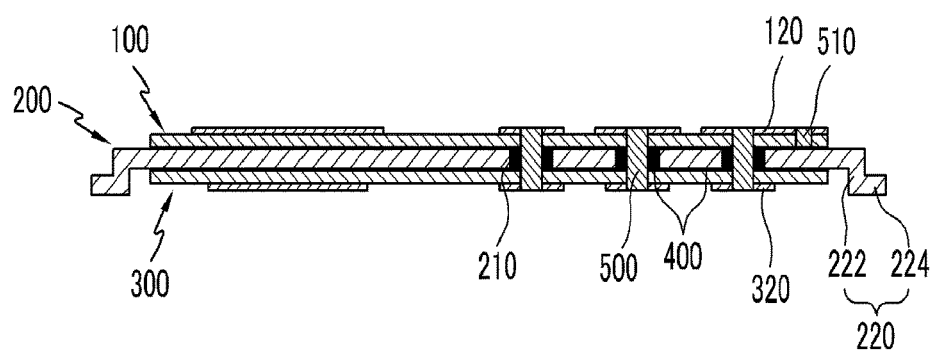

Next, in step (S50), as illustrated in FIG. 5e, both protruding end parts of the metal plate for spacer (200) are bent in two stages by the press working etc. to form a vertical extension part (222) and a horizontal extension part (224).

If the PCB process has been completed in this way, the circuit elements, i.e. the protective IC, resistors and capacitors, etc. are mounted on the lower PCB plate (300) by SMT process, whereby production of the battery protection device is completed.

Subsequently, the battery protection device thus produced is mounted on an upper surface of the battery cell on which a structure made of synthetic resin is previously disposed, and the "B+" terminal and the "B−" terminal are electrically connected to the battery cell, and the horizontal extension part (224) is joined to an end portion of the upper surface of the battery cell by spot-welding.

Meanwhile, in the configuration described above, the insulation hole (210) may be formed as a long hole embracing a plurality of the through-holes (500). Further, the 2-stage bent part, i.e. the vertical extension part (222) and the horizontal extension part (224) may be formed only at one side of the PCB, i.e. a portion at which the "P+" terminal is exposed.

Further, the through-holes (500) may be previously formed prior to formation of the PCB patterns. Also, the 2-stage bending process may be performed prior to formation of the PCB patterns or may be performed after formation of the patterns and prior to formation of the through-holes. In the case of forming the through-holes by the press working, the through-holes may be formed simultaneously with the 2-stage bending process. The 2-stage bending process may be finally performed after mounting various circuit elements.

Figure 6:
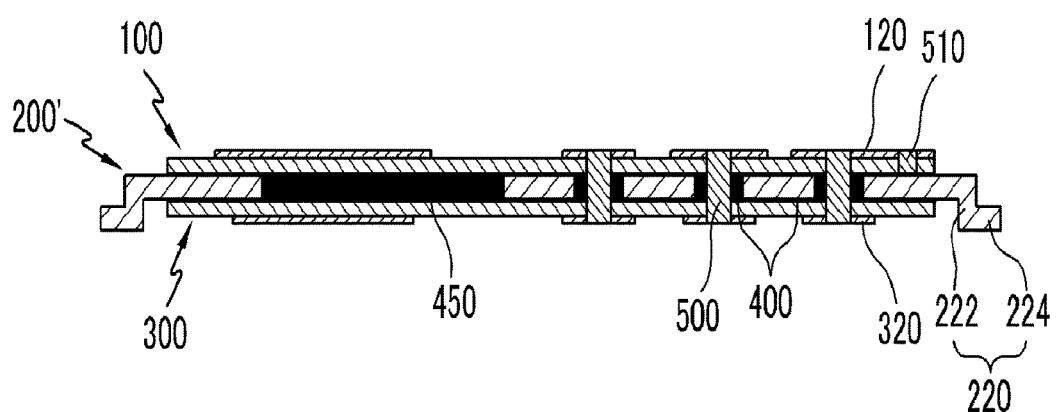
FIG. 6 is a longitudinal sectional view of a battery protection device according to another embodiment of the present invention.

FIG. 6 is a longitudinal sectional view of a battery protection device according to another embodiment of the present invention, wherein the same parts as those in FIG. 5e are designated by the same reference numerals and detailed descriptions thereof will be omitted. In the embodiment in FIG. 6, the metal plate for spacer (200') is formed at both end parts of the PCB while divided into two parts, unlike the embodiment previously described. A space between the two parts of the metal plate for spacer (200') may be filled with the adhesive (500) or the same FR4, BT or polyimide as material used for the PCB plate.

As above, preferred embodiments of the method for manufacturing a battery protection device and a battery protection device of the present invention have been described in detail with reference to the attached drawings, but these are merely illustrative, and various modifications and alterations will be possible within the scope of technical concept of the present invention. Therefore, the scope of right of the present invention should be defined by the following claims. Meanwhile, it should be mentioned that the steps of the manufacturing method in the claims is not necessarily preformed in a described order or alphabetical order.

Description of reference numerals

| | |
|---|---|
| 10: PCB | 12: through-hole |
| 20: metallic spacer | 22, 26: horizontal extension part |
| 24: vertical extension part | 30: circuit element |
| 32: thermistor | 40: battery cell |
| 50: structure made of synthetic resin | 110: synthetic resin plate |
| 100: upper PCB plate | 200: metal plate for spacer |
| 110: metallic thin film | 220: bent part |
| 210: insulation hole | 300: upper PCB plate |
| 222: vertical extension part | 400: adhesive |
| 224: horizontal extension part | |
| 310: synthetic resin plate | |
| 320: metallic thin film | |
| 500, 510: plating body | |

What is claimed is:

1. A method for manufacturing a battery protection device, comprising:
   a step (a) of preparing an upper printed circuit board (PCB) plate having a metallic thin film formed on an upper surface thereof, a lower printed circuit board (PCB) plate having a metallic thin film formed on a lower surface thereof, and a metal plate for spacer which has at least one part laterally protruding from sides of the upper PCB plate and the lower PCB plate and which has at least one insulation hole formed through the metal plate for spacer;
   a step (b) of joining the upper PCB plate and the lower PCB plate to each other with the metal plate for spacer interposed there between;
   a step (c) of forming circuit patterns on the upper PCB plate and the lower PCB plate;
   a step (d) of forming through-holes smaller than the insulation hole through the upper PCB plate and the lower PCB plate, and electrically connecting the upper PCB plate and the lower PCB plate through the through-holes;
   a step (e) of forming an exposure hole in the upper PCB plate so as to expose the metal plate for spacer, and electrically connecting the metal plate for spacer and the upper PCB plate through the exposure hole; and a step (f) of bending a protruding part of the metal plate for spacer in two stages to form a vertical extension part and a horizontal extension part.

2. The method for manufacturing a battery protection device according to claim 1, wherein in the step (d), circuit connection points of the lower PCB plate and at least a "P+" terminal, a "P−" terminal and a "CF" terminal of the upper PCB plate are electrically connected.

3. The method for manufacturing a battery protection device according to claim 1, wherein in the step (e), a "P+" terminal of the upper PCB plate and the metal plate for spacer are electrically connected.

4. The method for manufacturing a battery protection device according to claim 1, wherein the step (b) is performed using an adhesive or adhesive sheet made of insulating material, and the inside of the insulation hole is filled with the adhesive or adhesive sheet after the step (b).

5. The method for manufacturing a battery protection device according to claim 3, wherein the metal plate for spacer is made of aluminum, copper, phosphor bronze or beryllium copper having a nickel-plated surface or is made of aluminum, copper, phosphor bronze, beryllium copper or nickel.

6. The method for manufacturing a battery protection device according to claim 3, wherein the metal plate for spacer is divided into a right part and a left part, and a space between the right part and the left part is filled with insulating material.

7. A battery protection device comprising:
an upper PCB plate which has a circuit pattern formed on an upper surface thereof;
a metal plate for spacer which is joined to a lower part of the upper PCB plate and which laterally protrudes from at least one side of the upper PCB plate to form a vertical extension part and a horizontal extension part; and
a lower PCB plate which has a circuit pattern formed on a lower surface thereof and which is joined to a lower part of the metal plate for spacer,
wherein an insulation hole is formed through the metal plate for spacer, the upper PCB plate and the lower PCB plate are electrically connected through through-holes which are formed through the upper PCB plate and the lower PCB plate and which are smaller than the insulation hole, and the upper PCB plate and the metal plate for spacer are electrically connected through an exposure hole.

8. The battery protection device according to claim 7, wherein the lower PCB plate is connected to at least a "P+" terminal, a "P−" terminal and a "CF" terminal of the upper PCB plate through the through-holes.

9. The battery protection device according to claim 7, wherein a "P+" terminal of the upper PCB plate is electrically connected to the metal plate for spacer through the exposure hole.

10. The method for manufacturing a battery protection device according to claim 2, wherein the step (b) is performed using an adhesive or adhesive sheet made of insulating material, and the inside of the insulation hole is filled with the adhesive or adhesive sheet after the step (b).

11. The method for manufacturing a battery protection device according to claim 3, wherein the step (b) is performed using an adhesive or adhesive sheet made of insulating material, and the inside of the insulation hole is filled with the adhesive or adhesive sheet after the step (b).

12. The battery protection device according to claim 8, wherein the "P+" terminal of the upper PCB plate is electrically connected to the metal plate for spacer through the exposure hole.

* * * * *